United States Patent
Hocking (10) Patent No.: US 11,313,877 B2
(45) Date of Patent: Apr. 26, 2022

(54) NEAR-ZERO POWER WAKEUP ELECTRO-MECHANICAL SYSTEM

(71) Applicant: Kionix, Inc., Ithaca, NY (US)

(72) Inventor: Andrew Hocking, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 275 days.

(21) Appl. No.: 16/446,433

(22) Filed: Jun. 19, 2019

(65) Prior Publication Data
US 2020/0041538 A1    Feb. 6, 2020

Related U.S. Application Data

(60) Provisional application No. 62/687,118, filed on Jun. 19, 2018.

(51) Int. Cl.
*G01P 15/13* (2006.01)
*B81B 7/02* (2006.01)

(52) U.S. Cl.
CPC .............. *G01P 15/133* (2013.01); *B81B 7/02* (2013.01); *B81B 2201/0235* (2013.01)

(58) Field of Classification Search
CPC .. H01L 41/0825; G01P 15/133; G01P 15/125; H01G 5/16; H01G 5/18; H01G 5/40; B81B 2201/0235
See application file for complete search history.

(56) References Cited

U.S. PATENT DOCUMENTS

| | | | |
|---|---|---|---|
| 5,693,574 A | 12/1997 | Schuster et al. |
| 5,905,203 A | 5/1999 | Flach et al. |
| 6,245,636 B1 | 6/2001 | Maszara |
| 6,403,485 B1 | 6/2002 | Quek et al. |

(Continued)

FOREIGN PATENT DOCUMENTS

| | | | |
|---|---|---|---|
| DE | 102005042754 B4 | 9/2008 |
| EP | 1264330 B1 | 7/2003 |

(Continued)

OTHER PUBLICATIONS www.electrical4u.com, Wayback Machine Snapshot, Nov. 2016 (Year: 2016).*

(Continued)

*Primary Examiner* — Eric S. McCall
*Assistant Examiner* — Timothy P Graves
(74) *Attorney, Agent, or Firm* — Weaver Austin Villeneuve & Sampson LLP (57) ABSTRACT

A MEMS includes, in part, a parallel plate capacitor, a proofmass adapted to be displaced by a first distance from a rest state in response to a first voltage applied to the capacitor, and a piezoelectric material adapted to generate a second voltage in response to an external force applied to the MEMS. The second voltage causes the MEMS to transition from a standby mode to an active mode of operation. The proofmass is displaced by a second distance in response to the external force thereby causing the piezoelectric material to generate the second voltage. A spring couples the proofmass to the piezoelectric material, and a transistor turns on in response to the second voltage thereby causing the MEMS to transition to the active mode of operation. The proofmass returns to the rest state when the MEMS is in the active mode of operation.

12 Claims, 6 Drawing Sheets

(56) References Cited

U.S. PATENT DOCUMENTS

| | | | |
|---|---|---|---|
| 7,144,750 | B2 | 12/2006 | Ouellet et al. |
| 7,442,570 | B2 | 10/2008 | Nasiri et al. |
| 8,237,296 | B2 | 8/2012 | Hancer |
| 8,592,926 | B2 | 11/2013 | Montez et al. |
| 8,610,224 | B2 | 12/2013 | Naito et al. |
| 8,905,293 | B2 | 12/2014 | Liu et al. |
| 10,053,360 | B1 | 8/2018 | Heller |
| 10,167,191 | B2 | 1/2019 | Heller et al. |
| 10,766,767 | B2 | 9/2020 | Heller et al. |
| 10,793,427 | B2 | 10/2020 | Heller et al. |
| 2003/0067014 | A1 | 4/2003 | Tsuruta et al. |
| 2006/0098059 | A1* | 5/2006 | Ohguro .............. H01L 41/0973 347/72 |
| 2008/0283751 | A1* | 11/2008 | Kymissis ................. G01J 5/34 250/338.3 |
| 2009/0191660 | A1 | 7/2009 | Christenson et al. |
| 2010/0191676 | A1 | 7/2010 | Montez et al. |
| 2011/0074162 | A1* | 3/2011 | Cottone ................ H02K 35/02 290/1 R |
| 2012/0068325 | A1 | 3/2012 | Montez et al. |
| 2012/0205653 | A1 | 8/2012 | Nishikage et al. |
| 2012/0313235 | A1 | 12/2012 | Chu et al. |
| 2013/0068013 | A1 | 3/2013 | Beck et al. |
| 2013/0168740 | A1 | 7/2013 | Chen |
| 2013/0175643 | A1 | 7/2013 | Berthelot et al. |
| 2014/0091405 | A1 | 4/2014 | Weber |
| 2015/0008542 | A1 | 1/2015 | Kaelberer et al. |
| 2015/0344299 | A1 | 12/2015 | Chang et al. |
| 2015/0375990 | A1 | 12/2015 | Classen |
| 2016/0061679 | A1 | 3/2016 | Adams et al. |
| 2016/0107881 | A1 | 4/2016 | Thompson et al. |
| 2017/0057813 | A1 | 3/2017 | Shin et al. |
| 2018/0282153 | A1 | 10/2018 | Heller et al. |
| 2019/0263656 | A1 | 8/2019 | Heller et al. |
| 2020/0041538 | A1 | 2/2020 | Hocking |
| 2020/0048078 | A1 | 2/2020 | Heller et al. |

FOREIGN PATENT DOCUMENTS

| | | |
|---|---|---|
| WO | WO 2018/187486 A1 | 10/2018 |
| WO | WO 2018/187490 A1 | 10/2018 |

OTHER PUBLICATIONS

U.S. Appl. No. 157677,994, Ex Parte Quayle Action mailed Jan. 16, 2020.

WIPO Application No. PCT/US2018/026107, PCT International Preliminary Report on Patentability dated Oct. 8, 2019.

U.S. Appl. No. 15/677,994, Notice of Allowance dated Jun. 15, 2020.

U.S. Appl. No. 16/467,045, Notice of Allowance dated Apr. 28, 2020.

WIPO Application No. PCT/US2018/046324, PCT International Preliminary Report on Patentability dated Feb. 11, 2020.

EP 18751061.9 Extended European Search Report dated Dec. 4, 2020.

U.S. Appl. No. 16/655,127, Non-Final Office Action dated Dec. 22, 2020.

U.S. Appl. No. 16/407,045, Notice of Allowance dated Jan. 15, 2020.

WIPO Application No. PCT/US2018/026111, PCT International Preliminary Report on Patentability dated Oct. 8, 2019.

Eichler et al., "Plasma Activation as a Pretreatment Tool for Low-Temperature Direct Wafer Bonding in Microsystem Technology," ECS Transactions, 50(7):265-276, (2012).

Evertsson et al., "The thickness of native oxides on aluminum alloys and single crystals," Applied Surface Science, 349: 826-832, (2015).

Gabriel et al. "Lokale Plasma-Behandlung in einem Mask Aligner zur selektiven Veränderung der Oberfläche von Wafern Local plasma treatment in a Mask Aligner for selective wafer surface modification," Mikrosystemtechnik Kongress, pp. P8.24-P8.24, (2009). A. Gabriel et al., "Wafer direct bonding with ambient pressure plasma activation," Microsyst Technol, 12:397-400, (2006).

Heller et al., "Surface Preparation and Eutectic Wafer Bonding," ECS Transactions, 75(9):229-239, (2016).

Jeurgens et al., "Determination of thickness and composition of aluminum-oxide overlayers on aluminum substrates," Applied Surface Science, 144-145:11-15, (1999).

Klages et al., "Surface Technology with Cold Microplasmas," Plasma Processes and Polymers, 4, 208-218, (2007).

McAlister et al., "The Al—Ge (Aluminum-Germanium) system," Bulletin of Alloy Phase Diagrams, 5:341-347, (1984). Errata 6(2):111-113 and 183-184, (1985).

Okamoto, "Al—Ge (Aluminum-Germanium)," Journal of Phase Equilibria, 19(1):86, (1998).

Onsia et al., "A Study of the Influence of Typical Wet Chemical Treatments on the Germanium Wafer Surface," Solid State Phenomena, 103-104:27-30, (2005).

Sood, "Advanced Metal-Eutectic Bonding for High Volume MEMS WLP," IEEE MEMS Bay Area Meeting, 30 pages, (2014).

Sood, et al., "Al—Ge Eutectic Wafer Bonding and Bond Characterization for CMOS Compatible Wafer Packaging," ECS Transactions, 33(4):93-101, (2010).

Zavracky et al., "Patterned Eutectic Bonding with Al/Ge Thin Films for MEMS," SPIE, 2639:46-52, (1995).

U.S. Appl. No. 15/685,879, Notice of Allowance dated Apr. 4, 2018.

U.S. Appl. No. 15/685,957, Notice of Allowance dated Aug. 31, 2018.

U.S. Appl. No. 15/677,994, Non-Final Office Action dated May 30, 2019.

WIPO Application No. PCT/US2018/026107, PCT International Search Report and Written Opinion of the International Searching Authority dated Jun. 21, 2018.

WIPO Application No. PCT/US2018/026111, PCT International Search Report and Written Opinion of the International Searching Authority dated Aug. 23, 2018.

WIPO Application No. PCT/US2018/046324, PCT International Search Report and Written Opinion of the International Searching Authority dated Sep. 14, 2018.

U.S. Appl. No. 16/467,645, Notice of Allowance dated Jan. 15, 2020.

U.S. Appl. No. 16/655,127, Final Office Action dated Apr. 21, 2021.

\* cited by examiner

Causing a near-buckling condition of a beam that mechanically couples the proofmass to the spring in response to the first voltage

FIG. 7C pushing a pinned beam that mechanically couples the proofmass to the spring in response to the first voltage

FIG. 7D inhibiting the generation of the second voltage when the MEMS is in the active mode of operation

FIG. 7E

Returning the proofmass to the rest state when the MEMS is in the active mode of operation

NEAR-ZERO POWER WAKEUP ELECTRO-MECHANICAL SYSTEM

CROSS REFERENCE TO RELATED APPLICATIONS

The present application claims benefit under 35 USC 119(e) of U.S. Application Ser. No. 62/692,469, filed Jun. 19, 2018, the content of which is incorporated herein by reference in its entirety.

The present application is related to U.S. application Ser. No. 16/392,224, filed Apr. 23, 2019, the content of which is incorporated herein by reference in its entirety.

FIELD OF THE INVENTION

The present invention relates to Micro Electro-Mechanical System (MEMS) devices, and more particularly to near-zero wakeup power in such systems.

BACKGROUND

MEMS devices, such as motion sensors, inertial sensors, and movable mirrors are in wide use. As is well known, a MEMS motion sensor may be, for example, an accelerometer for detecting linear motion or a gyroscope for detecting rotation and angular velocities.

Consumers of MEMS sensors are constantly looking for smaller, more space-efficient sensors that maintain or improve on performance standards within MEMS-related technologies. A need continues to exist for an improved MEMS.

SUMMARY OF THE INVENTION

A MEMS, in accordance with one embodiment of the present invention, includes, in part, a capacitor, a proofmass adapted to be displaced by a first distance from a rest state in response to a first voltage applied to the capacitor, and a piezoelectric material adapted to generate a second voltage in response to an external force applied to the MEMS. The second voltage caused the MEMS to transition from a standby mode to an active mode of operation. In one embodiment, the proofmass is adapted to be displaced by a second distance in response to the external force thereby causing the piezoelectric material to generate the second voltage.

In one embodiment, the MEMS further includes, in part, a spring coupling the proofmass to the piezoelectric material. In one embodiment, the MEMS further includes, in part, a transistor adapted to be turned on in response to the second voltage. In one embodiment, the transistor is adapted to generate a current when turned on to cause the MEMS to transition to the active mode of operation.

In one embodiment, the first voltage causes a near-buckling condition of a beam that mechanically couples the proofmass to the spring. In one embodiment, the first voltage pushes a pinned beam that mechanically couples the proofmass to the spring. In one embodiment, the first voltage is supplied by a battery. In one embodiment, the piezoelectric material is adapted not to generate the second voltage when the MEMS is in the active mode of operation. In one embodiment, the proofmass returns to the rest state when the MEMS is in the active mode of operation.

A method of operating a MEMS, in accordance with one embodiment of the present invention, includes, in part, displacing a proofmass of the MEMS by a first distance from a rest state in response to a first voltage applied to a capacitor also disposed in the MEMS, generating a second voltage in response to an external force applied to the MEMS, and causing the MEMS to transition from a standby mode to an active mode of operation in response to the generation of the second voltage.

In one embodiment, the method further includes, in part, displacing the proofmass by a second distance in response to the external force thereby causing the piezoelectric material to generate the second voltage. In one embodiment, the method further includes, in part, transferring a force caused by the second displacement of the proofmass to the piezoelectric material using a spring disposed in the MEMS.

In one embodiment, the method further includes, in part, turning on a transistor in response to the second voltage. In one embodiment, the method further includes, in part, causing the MEMS to transition to the active mode of operation in response to a current generated by the transistor.

In one embodiment, the method further includes, in part, causing a near-buckling condition of a beam that mechanically couples the proofmass to the spring in response to the first voltage. In one embodiment, the method further includes, in part, pushing a pinned beam that mechanically couples the proofmass to the spring in response to the first voltage. In one embodiment, the first voltage is supplied by a battery. In one embodiment, the method further includes, in part, inhibiting the generation of the second voltage when the MEMS is in the active mode of operation. In one embodiment, the method further includes, in part, returning the proofmass to the rest state when the MEMS is in the active mode of operation.

DETAILED DESCRIPTION OF THE INVENTION

In accordance with one embodiment of the present invention, during a standby mode, a proofmass disposed in a MEMS is displaced from its rest state in response to a constant voltage applied to a capacitor otherwise adapted to measure the amount of displacement of the proofmass in response to an externally applied force. In the following description, the proofmass is referred to as being in the (i) rest state when receiving no force, either externally or internally, or (ii) standby equilibrium state when the MEMS is in the standby mode. While in the standby equilibrium state, the MEMS is in a near unstable state. Therefore, the proofmass is defined as being in the standby equilibrium state when displaced from its rest state in response to the application of a constant voltage applied to the capacitor.

The voltage applied to the capacitor during the standby mode causes the spacing between the plates of the capacitor to shrink thereby exerting a force on the proofmass and causing it be in the standby equilibrium state. Because the force on the proofmass is inversely proportional to the square of the distance between the capacitor plates, the application of an external force to the MEMS when the MEMS is in the standby mode causes the proofmass to be displaced by an amount sufficient to cause the MEMS to reach a pull-in state, thus leading to further motion and stress in the spring. The stress in the spring, in turn, results in the exertion of a force on a piezoelectric material. The force exerted on the piezoelectric material is large enough to cause the piezoelectric material to generate a voltage that turns on a transistor and causes the MEMS to wake up from the standby mode. Once the MEMS is in a wake (active) state, the application of the internal voltage to the capacitor is terminated thus causing the proofmass to return to its rest state. Such internal voltage is supplied by a battery powering the MEMS.

Figure 1:
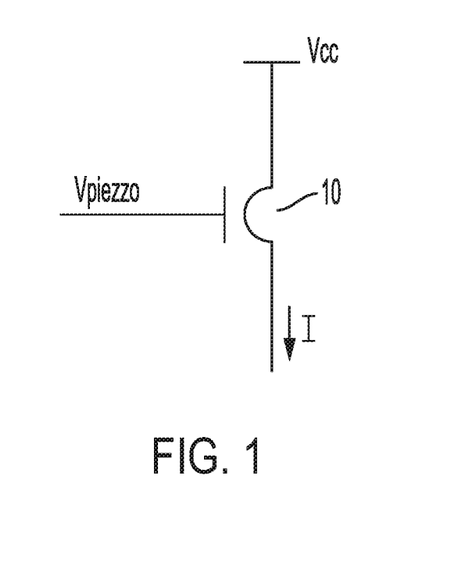
FIG. 1 is a schematic diagram of a transistor switch used in MEMS device, in accordance with one embodiment of the present invention.

FIG. 1 is a schematic diagram of a MOS transistor switch 10 that is used in a MEMS device, in accordance with one embodiment of the present invention. In response to the application of a force when the MEMS (not shown in FIG. 1) is in a standby mode, the piezoelectric device (not shown in FIG. 1), as described above, generates a voltage $V_{Piezo}$ that is applied to the gate terminal of the MOS transistor. This voltage causes the transistor to turn on and generate a current I that flows from the supply voltage $V_{cc}$ to wake up the MEMS device. Once the MEMS device is in the active state, the piezoelectric material no longer generates voltage $V_{Piezo}$ thereby causing the transistor to turn off.

Figure 2:
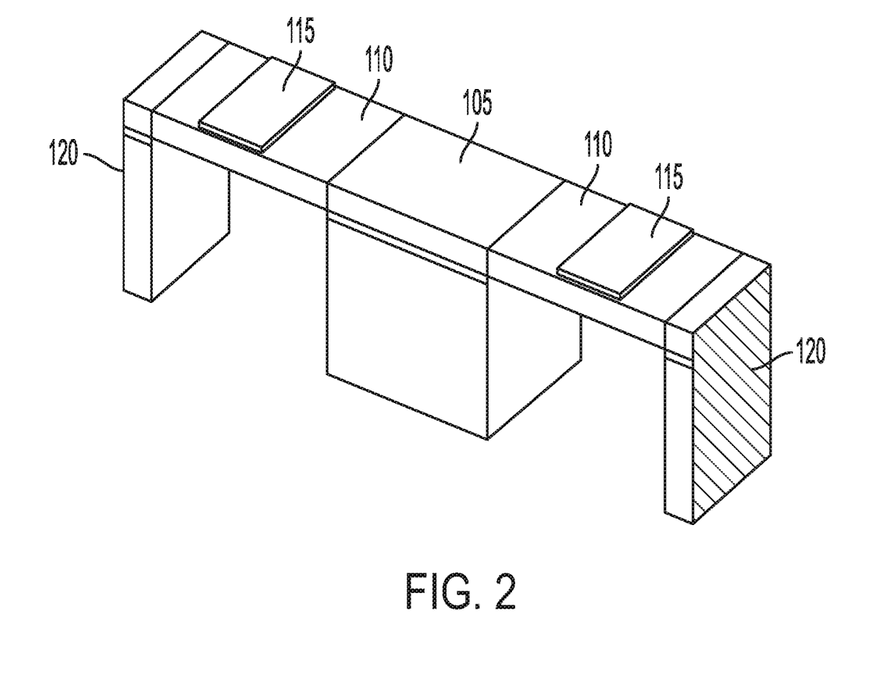
FIG. 2 is a simplified schematic perspective view of a number of components of a MEMS, in accordance with one embodiment of the present invention.

FIG. 2 is a simplified schematic perspective view of a number of components of a MEMS 100, in accordance with one embodiment of the present invention. MEMS 100 is shown as including, in part, a proofmass 105, spring 110 and piezoelectric material 115 covering a portion of spring 110. Also shown are anchors 120 that secure the ends of spring 110 to the body of the MEMS. An external force applied to MEMS 100 when the MEMS 100 is in a standby mode displaces the proofmass from its standby equilibrium position. This displacement is transferred to piezoelectric material 115 through spring 110, in turn causing the piezoelectric material 115 to generate voltage $V_{Piezo}$ and wake up the MEMS 100, as described above with reference to FIG. 1.

The piezoelectric material may be caused to generate the voltage $V_{Piezo}$ due to an external force when the proofmass in a standby equilibrium state in any number of ways. For example, in one embodiment and as described above, the voltage applied to the parallel plate capacitor may displace the proofmass to a near pull-in position. In another embodiment, the displacement of the proofmass due to the voltage applied to the capacitor may cause a beam disposed in the MEMS reach a near-buckling position thereby to achieve elastic instability necessary for the piezoelectric material to generate the voltage $V_{Piezo}$. In yet another example, the displacement of the proofmass due to the voltage applied to the capacitor may cause a pinned beam to be pushed strongly enough to create an elastic instability necessary for the piezoelectric material to generate the voltage $V_{Piezo}$ in response to an external force.

The thickness of proofmass 105 may be selected in accordance with any number of criterion. For example, in one embodiment, the proofmass may be selected to be as thick as the spring. In another embodiment, the proofmass may be, for example, as thick as the wafer in which it is formed. In one embodiment, the piezoelectric device may include such Aluminum Nitride (AlN), Scandium Aluminum Nitride (ScAlN), or Lead Zirconate Titanate (also known as PZT).

Figure 3:
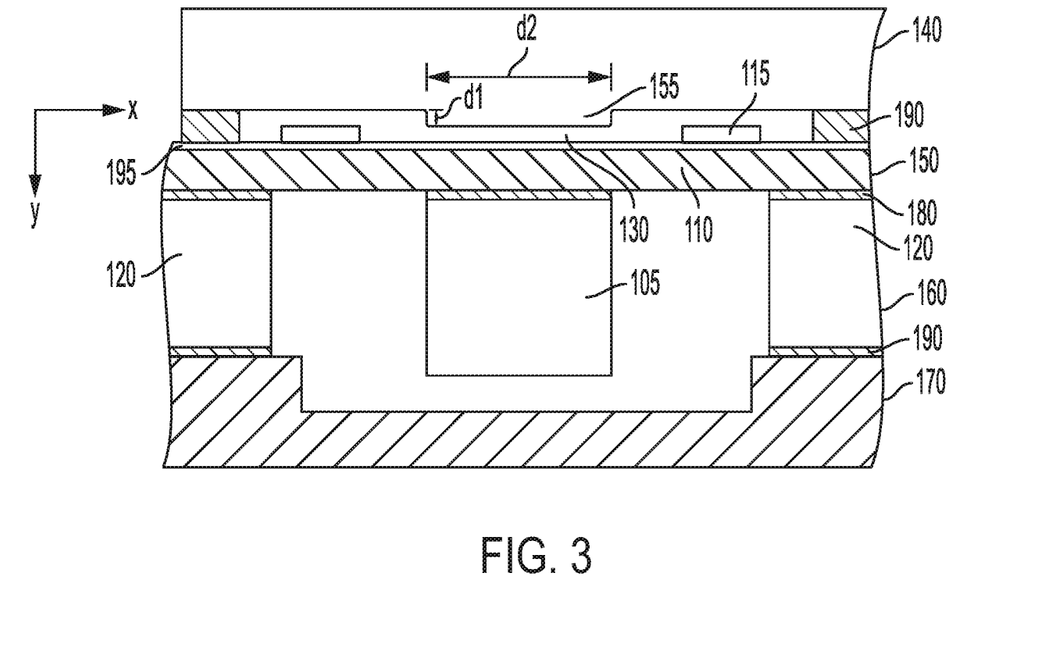
FIG. 3 is a more detailed view of the MEMS shown in FIG. 2, in accordance with one embodiment of present invention.

FIG. 3 is a more detailed view of the MEMS device shown in FIG. 2, in accordance with one embodiment of present invention. As seen, the MEMS device is formed in the central SOI wafer which includes, in part, device layer 150 and handle layer 160, and is also shown as being coupled to bottom wafer 170 via anchors 120. Bonding material 190 is formed between anchors 120 and bottom wafer 170, as well as between device layer 150 of the central wafer and lid wafer 140. Piezoelectric material 115 is formed on device layer 150. Gap 130 separates the first plate 155—formed in lid wafer 140 and shown as having a length and a width of $d_1$ and $d_2$—of the parallel plate capacitor from the second plate of the capacitor in device layer 150, shown as positioned below gap 130 and connected to proofmass 105. Both lid wafer 140 and device layer 150 are highly conductive. Also shown is buried oxide layer 180 formed in device layer 150 and handle layer 160.

Figure 4:
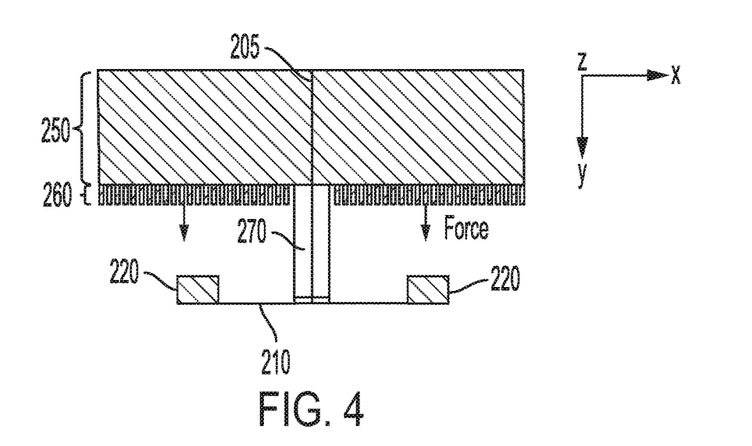
FIG. 4 is a simplified schematic top view of a number of components of a MEMS, in accordance with one embodiment of the present invention.

FIG. 4 is a simplified schematic top view of a number of components of a MEMS 200, in accordance with one embodiment of the present invention. MEMS 200 is shown as including, in part, a proofmass 205, and a spring 210 shown as being secured to the MEMS body via anchors 220. Proofmass 205 is shown as being connected to spring 201 via beam 270.

Figure 8:
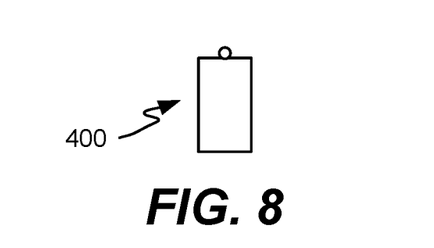
FIG. 8 shows a battery that may be used to generate a voltage to displace the proofmass from a rest state.

Proofmass 205 is adapted to be displaced in the y-direction in response to a force. Proofmass 205 is shown as including a solid part 250 and fingers 260. When the MEMS 200 is in the standby mode, in response to an applied voltage generated by, for example, a battery 400 shown in FIG. 8, and as described above, fingers 260 cause proofmass 205 to be pulled in the Y-direction thus inducing elastic instability. If an external force is subsequently applied to MEMS 200 in the Z-direction, proofmass 205 is displaced further. This additional displacement of the proofmass is transferred as a force to the piezoelectric material thus causing the piezoelectric material (not shown in FIG. 3) to generate a voltage. The voltage generated by the piezoelectric material is sufficiently large to turn on transistor 10 of FIG. 1 and cause the MEMS 200 to transition from the stand-by mode to wake-up or active mode.

In one embodiment, the spring may be between 5-10 μm in height and include a layer of piezoelectric, such as Scandium Aluminum Nitride (ScAln), that is, for example, 1 μm in height. The proofmass may be as thick as the substrate in which it is formed, e.g., 400 μm. Such a MEMS may be formed using an SOI wafer that includes on-chip MOSFETs. The lid may have an electrode which destabilizes the MEMS using the entirety of the proofmass as the capacitive area.

Figure 5:
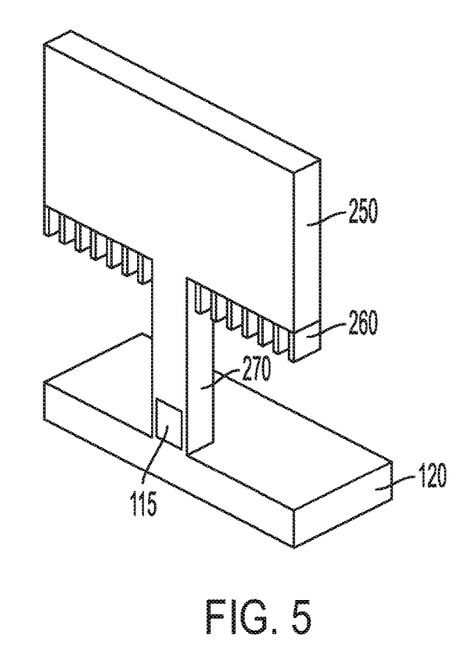
FIG. 5 is a perspective view of the MEMS of FIG. 4, in accordance with one embodiment of the present invention.
Figure 6:
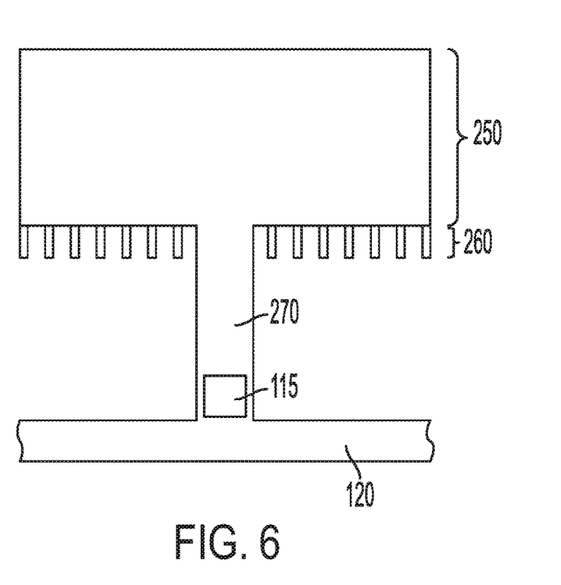
FIG. 6 is a top view of the MEMS of FIG. 5.

FIG. 5 is a perspective view of MEMS 200 of FIG. 4, in accordance with one embodiment of the present invention. In this embodiment, piezoelectric material 105 is formed on beam 270 as shown. FIG. 6 is a top view of the MEMS 200 of FIG. 5.

Figure 7A:
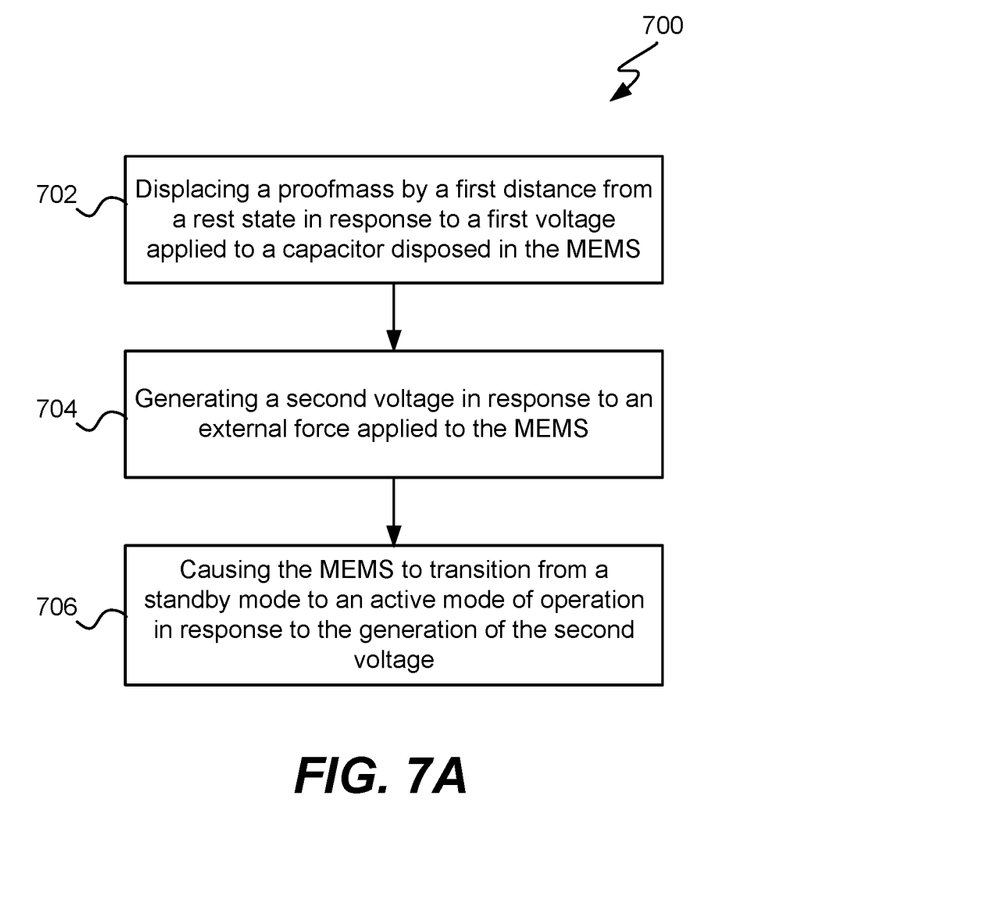
FIGS. 7A, 7B, 7C, 7D, 7E, and 7F are exemplary flowcharts for operating a MEMS, in accordance with various embodiment of the present disclosure.

FIG. 7A is an exemplary flowchart 700 for operating a MEMS, in accordance with one embodiment of the present invention. At 702, a proofmass of the MEMS is displaced by a first distance from a rest state in response to a first voltage applied to a capacitor also disposed in the MEMS. At 704, a second voltage is generated in response to an external force applied to the MEMS. At 706, the second voltage causes the MEMS to transition from a standby mode to an active mode of operation.

Figure 7B:
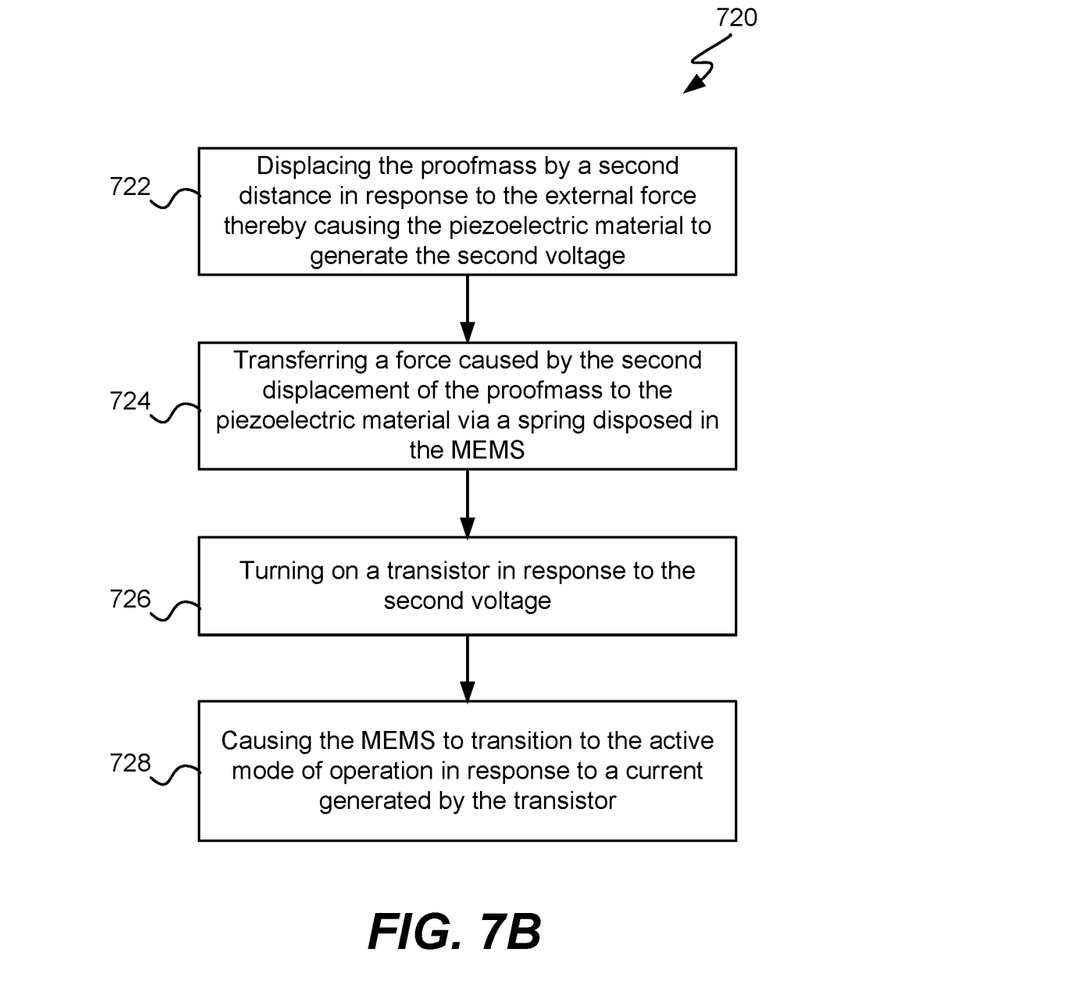

In one exemplary embodiment, as depicted in flowchart 720 shown in FIG. 7B, at 722 the proofmass is displaced by a second distance in response to the external force, thereby causing the piezoelectric material to generate the second voltage. At 724, a force caused by the second displacement of the proofmass is transferred to the piezoelectric material using a spring disposed in the MEMS. At 726, a transistor is turned on in response to the second voltage. At 728, the MEMS is transitioned to the active mode of operation in response to a current generated by the transistor.

Figure 7C:
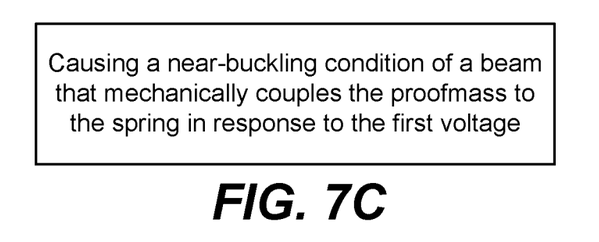
Figure 7D:
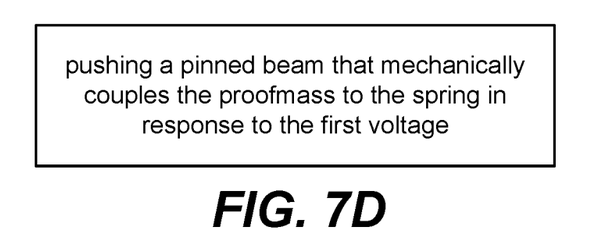
Figure 7E:
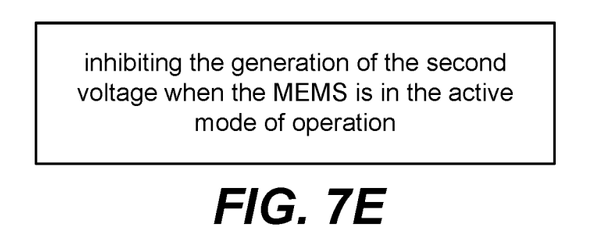
Figure 7F:
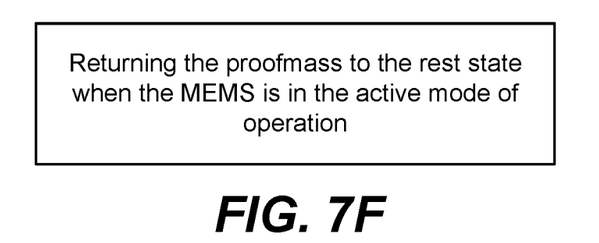

In one exemplary embodiment, as shown in the flowchart of FIG. 7C, a beam that mechanically couples the proofmass to the spring is caused to be near-buckling condition in response to the first voltage. In one exemplary embodiment, as shown in the flowchart of FIG. 7D, a pinned beam that mechanically couples the proofmass to the spring is pushed in response to the first voltage. In one exemplary embodiment, as shown in the flowchart of FIG. 7E, the generation of the second voltage when the MEMS is in the active mode of operation is inhibited. In one exemplary embodiment, as shown in the flowchart of FIG. 7F, the proofmass is returned to the rest state when the MEMS is in the active mode of operation.

A near-zero power wakeup MEMS device, in accordance with embodiments of the present invention may be used in a number of electronic devices and applications, such as smart cards, key fobs, tracking shipment accelerations, earthquake sensing, etc.

The above embodiments of the present invention are illustrative and not limitative. Other additions, subtractions or modifications are obvious in view of the present disclosure and are intended to fall within the scope of the appended claims.

What is claimed is:

1. A MEMS comprising:
    a voltage source supplying a first voltage;
    a capacitor;
    a proofmass displaced by a first distance from a rest state when the first voltage is applied to the capacitor, said first distance displacement defining a standby mode of operation of the MMES, wherein said proofmass is displaced by a sum of the first distance and a second distance when the MEMS receives an external force;
    a piezoelectric material generating a second voltage when the proofmass is displaced by the sum of the first and second distances; and
    a transistor generating a current in response to the second voltage thereby to activate the MEMS.

2. The MEMS of claim 1 further comprising:
    a spring coupling the proofmass to the piezoelectric material.

3. The MEMS of claim 2 wherein said first voltage causes a near-buckling condition of a beam that mechanically couples the proofmass to the spring.

4. The MEMS of claim 2 wherein said first voltage pushes a beam that mechanically couples the proofmass to the spring.

5. The MEMS of claim 2 wherein said first voltage source is a battery.

6. The MEMS of claim 1 wherein said proofmass returns to the rest state after the MEMS is activated.

7. A method of operating a MEMS, the method comprising:
    displacing a proofmass by a first distance from a rest state in response to a first voltage applied to a capacitor disposed in the MEMS, said first voltage supplied by a voltage source, said first distance displacement defining a standby mode of operation of the MMES;
    displacing the proofmass by a sum of the first distance and a second distance when the MEMS receives an external force;
    generating, by a piezoelectric material, a second voltage when the proofmass is displaced by the sum of the first and second distances; and
    generating a current by a transistor in response to the second voltage thereby to activate the MEMS.

8. The method of claim 7 further comprising:
    transferring a force caused by the sum of the first and second displacement of the proofmass to the piezoelectric material via a spring disposed in the MEMS.

9. The method of claim 8 further comprising:
    causing a near-buckling condition of a beam that mechanically couples the proofmass to the spring in response to the first voltage.

10. The method of claim 8 further comprising:
    pushing a beam that mechanically couples the proofmass to the spring in response to the first voltage.

11. The method of claim 8 wherein said first voltage source is a battery.

12. The method of claim 7 further comprising:
    returning the proofmass to the rest state after the MEMS is activated.

* * * * *